United States Patent [19]
Sato

[11] Patent Number: 5,519,249
[45] Date of Patent: *May 21, 1996

[54] VERTICAL TYPE BIPOLAR TRANSISTOR

[75] Inventor: Fumihiko Sato, Tokyo, Japan

[73] Assignee: NEC Corporation, Tokyo, Japan

[*] Notice: The term of this patent shall not extend beyond the expiration date of Pat. No. 5,321,301.

[21] Appl. No.: 223,032

[22] Filed: Apr. 5, 1994

[30] Foreign Application Priority Data

Apr. 5, 1993 [JP] Japan .................................. 5-077301

[51] Int. Cl.$^6$ .......................... H01L 29/70; H01L 27/082; H01L 27/102
[52] U.S. Cl. ................ 257/587; 257/588; 257/592
[58] Field of Search ..................... 257/587, 588, 257/592, 591, 593, 900

[56] References Cited

U.S. PATENT DOCUMENTS

| 5,321,301 | 6/1994 | Sato et al. | 257/592 |
| 5,323,032 | 6/1994 | Sato et al. | 257/588 |

OTHER PUBLICATIONS

Sze; "Semiconductor Devices Physics and Technology"; pp. 371–372; 1985.
F. Sato et al., "A Self–Aligned Selective MBE Technology For High–Performance Bipolar Transistors," *IEDM Technical Digest*, pp. 607–610 (1990).

*Primary Examiner*—Wael M. Fahmy
*Attorney, Agent, or Firm*—Burns, Doane, Swecker & Mathis

[57] ABSTRACT

A semiconductor device having a monocrystalline semiconductor layer, a first insulating film, a base leading electrode, and a second insulating film is arranged such that a predetermined pattern window is provided in the second insulating film, a third insulating film of silicon oxide is provided between two peripheries of the predetermined pattern window, a first window is provided between a side of the second insulating film and a side of the third insulating film, a second window extends from the first window and is larger than the first window so that the base leading electrode and the third insulating film have overhang portions, first spacers are provided respectively in alignment with the peripheries of the predetermined pattern window and in alignment with the sides of the third insulating film, second spacers cover the first spacers and the overhang portions, and emitter layers are provided between and in self-alignment with the second spacers. The width of the emitter layer is determined by the opening width of the first window and the widths of the first and the second spacers.

9 Claims, 9 Drawing Sheets

FIG. I
PRIOR ART
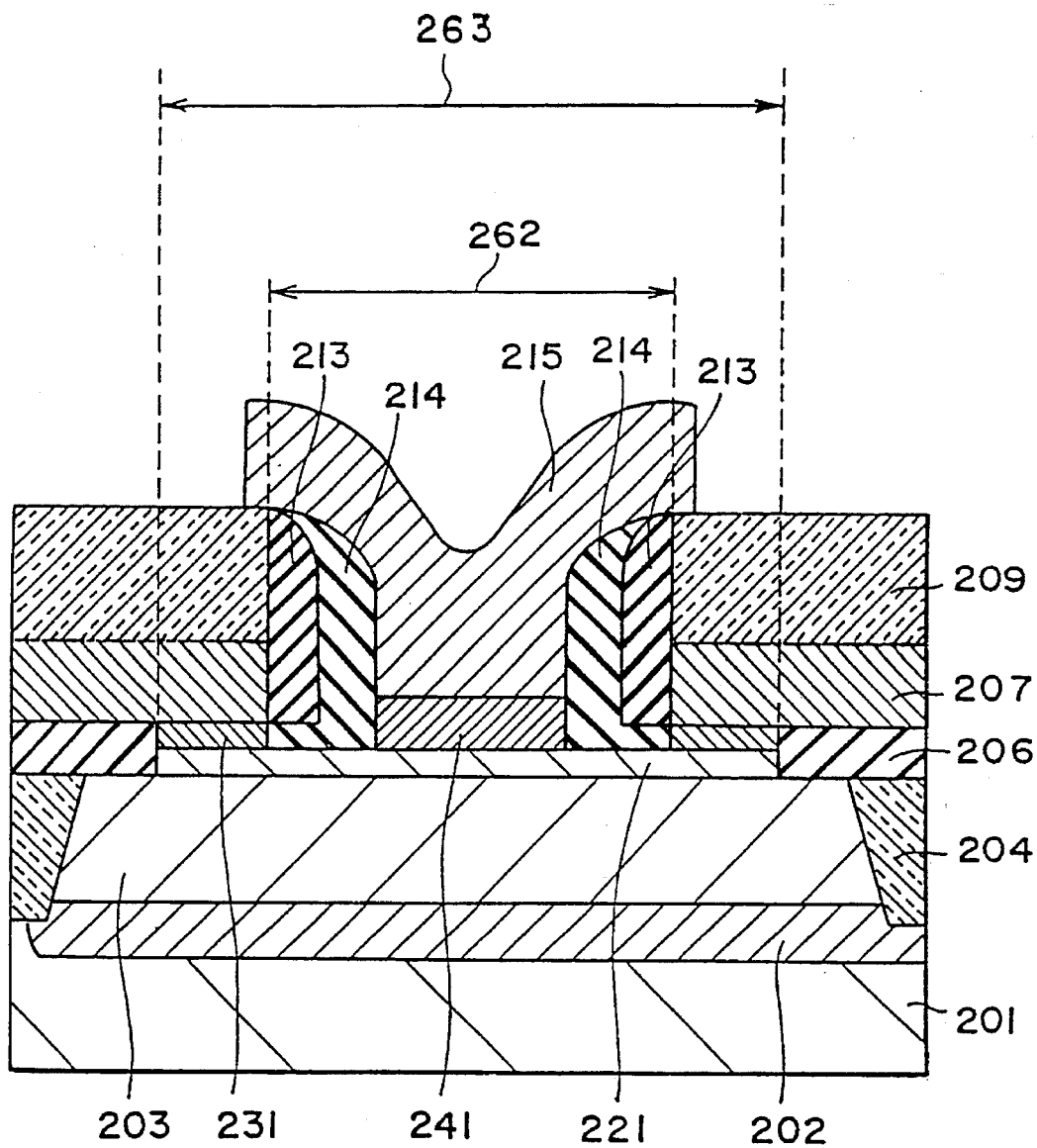

VERTICAL TYPE BIPOLAR TRANSISTOR

BACKGROUND OF THE INVENTION

(1) Field of the Invention

The present invention relates to a semiconductor device, and more particularly to a vertical type bipolar transistor structure and a method for fabricating the same.

(2) Description of the Related Art

For high-speed bipolar transistors, it is important to enhance cut-off frequency and to decrease parasitic capacitance and parasitic resistance. One way to accomplish this is to employ a vertical type bipolar transistor structure with a self-aligned film forming technique used to the fullest extent in the fabrication thereof. The inventor together with other authors, that is, F. Sato et al., proposed one of such bipolar transistor structures under the title "A self-aligned selective MBE technology for high-performance bipolar transistors" in IEDM Technical Digest, pp. 607–610 (1990). The proposal relates to a self-aligned bipolar transistor with an epitaxial Si base layer using "self-aligned" selective MBE technology, which the authors call SSSB (Super Self-aligned Selectively grown Base) technology.

The proposed bipolar transistor referred to above is configured as shown in FIG. 1 which is a diagrammatic sectional view thereof.

On the surface of a $p^-$-type silicon substrate 201, a buried $n^+$-type layer 202 is selectively provided. The entire surface of a $p^-$-type silicon substrate 201 is covered by an $n^-$-type silicon epitaxial layer 203. This $n^-$-type silicon epitaxial layer 203 is isolated by a LOCOS type silicon oxide film 204. A surface of the $n^-$-type silicon epitaxial layer 203 is entirely covered by an insulating film 206. There is a phosphorus diffusion layer (not shown) which reaches the $n^+$-type buried layer 202 through an opening (not shown) provided in the insulating film 206. This phosphorus diffusion layer constitutes a collector plug region and has a phosphorus concentration not less than $10^{19}$ cm$^{-3}$. On the insulating film 206, there are selectively provided a base leading electrode 207 of a $p^+$-type polycrystalline silicon film and a collector leading electrode (not shown) of an $n^+$-type polycrystalline silicon film. This collector leading electrode is connected to the phosphorus diffusion layer through the opening. The surfaces of the insulating film 206, the base leading electrode 207 and the collector leading electrode are covered by an insulating film 209.

A first window 262 is provided extending through the insulating film 209 and the base leading electrode 207, and a spacer 213 in an insulating material is provided at sides of the window 262. A second window 263 larger than the first window 262 in a predetermined width (in sectional view) is provided in the insulating film 206. The second window 263 provides an overhang portion of the base leading electrode 207. An intrinsic base layer 221 formed of a p-type monocrystalline semiconductor layer and self-aligned with the second window 263 covers the $n^-$-type silicon epitaxial layer 203. A p-type polycrystalline semiconductor connecting layer 231 is provided in such a way that an upper face thereof is self-aligned to an under surface of the base leading electrode 207, the under surface being an exposed surface of the overhang portion, and an under face thereof is in contact with the intrinsic base layer 221. The p-type monocrystalline semiconductor layer constituting the intrinsic base layer 221 is selectively grown on a surface of the $n^-$-type silicon epitaxial layer 203 using, for example, an MBE growth method. The intrinsic base layer 221 is constituted by, for example, a p-type monocrystalline semiconductor silicon layer. In the MBE growth, the polycrystalline semiconductor layer selectively grows-on the under face of the base leading electrode 207, the under face being an exposed surface of the overhang portion of the base leading electrode 207.

A spacer 214 formed of an insulating film covers an exposed surface of the above-mentioned spacer 213. An emitter layer 241 formed of an n-type monocrystalline semiconductor layer is self-aligned with the spacer 214 on a surface of the intrinsic base layer 221. In the window 262 and other windows or openings (not shown) which extend to the base leading electrode 207 and the collector leading electrode provided in the insulating film 209, there are provided such elements as aluminum alloy electrodes 215 which are respectively connected to layers such as the emitter layer 241.

In the conventional bipolar transistor described above, the emitter layer 241 formed results in a size of (opening width of the window 262)$-2\times$[(film thickness of the spacer 213)+(film thickness of the spacer 214)]. The opening width of the window 262 is larger than the sum of thicknesses of the spacers 213 and 214 and the precision of the dimension of the opening width thus formed is dependent on the precision of photolithography (the precision in photoresist patterns and that in dry etching). That is, the dimension precision of the thus finished emitter layer 241 formed is greatly dependent on the finished opening width of the window 262.

In the conventional bipolar transistor having the above configuration, the emitter layer whose finished dimension is minute or fine suffers from a low dimension precision. For example, when the lithography precision (absolute error) is $\pm 0.05$ μm and the emitter layer is to be formed to a dimension smaller than about 0.5 μm, the relative error in the dimension of the emitter layer will be larger than about 10%. Therefore, in the emitter layer having a minute finished dimension, there will be a large variations in current values (proportional to an area of the emitter layer) of the transistor.

SUMMARY OF THE INVENTION

An object of the invention, therefore, is to overcome the problems existing in the prior art and to provide an improved bipolar transistor which has a fine emitter layer and in which a variation in current values of the transistor is small.

Another object of the invention is to provide a structure in which the dimension precision of the finished emitter layer is not dependent on the precision of photolithography (i.e., the precision in photoresist patterns and in dry etching).

According to one aspect of the invention, there is provided a semiconductor device having a monocrystalline semiconductor layer, a first insulating film covering the monocrystalline semiconductor layer, a base leading electrode disposed on the first insulating film, and a second insulating film provided on the base leading electrode, the semiconductor device comprising:

a predetermined pattern window provided in the base leading electrode and the second insulating film;

a third insulating film provided in a middle portion between peripheries of the predetermined pattern window;

a first window provided between an inner side of the second insulating film as well as an inner side of the base leading electrode and an outer side of the third insulating film;

a second window provided below the first window and provided in the first insulating film, the second window extending outwardly from the inner side of the base leading electrode and inwardly from the outer side of the third insulating film so as to be larger than the first window such that the base leading electrode has a first overhang portion and the third insulating film has a second overhang portion;

first spacers having an inner first spacer covering the outer side of the third insulating film and an outer first spacer covering the inner sides of the second insulating film and the base leading electrode;

second spacers having an inner second spacer covering the inner first spacer and an under surface of the second overhang portion of the third insulating film and an outer second spacer covering the outer first spacer; and an emitter layer provided in self-alignment with the inner second spacer and the outer second spacer.

According to the invention, the width of the emitter layer is determined by the opening width of the first window and the widths of the first and the second spacers. The precision of the width of the first window is not dependent on the photoresist pattern but is dependent on the third insulating film which is formed by selective oxidation. The absolute error in the opening width of the first window is within a substantially constant range. The same is true with the widths of the first and second spacers so that the absolute error in the width of the emitter layer is within a substantially constant range. Thus, the invention provides a bipolar transistor in which the current values in transistors vary very little. Also, according to the invention, it is possible to realize an emitter layer whose width can be narrower than the minimum process limitation obtainable by photolithography.

BRIEF DESCRIPTION OF THE DRAWINGS

The above and other objects, features and advantages of the present invention will be apparent from the following description of preferred embodiments of the invention explained with reference to the accompanying drawings, in which:

FIG. 1 is a diagrammatic sectional view of a conventional bipolar transistor;

PREFERRED EMBODIMENTS OF THE INVENTION

Now, preferred embodiments of the invention are explained with reference to the accompanying drawings.

Figure 2A:
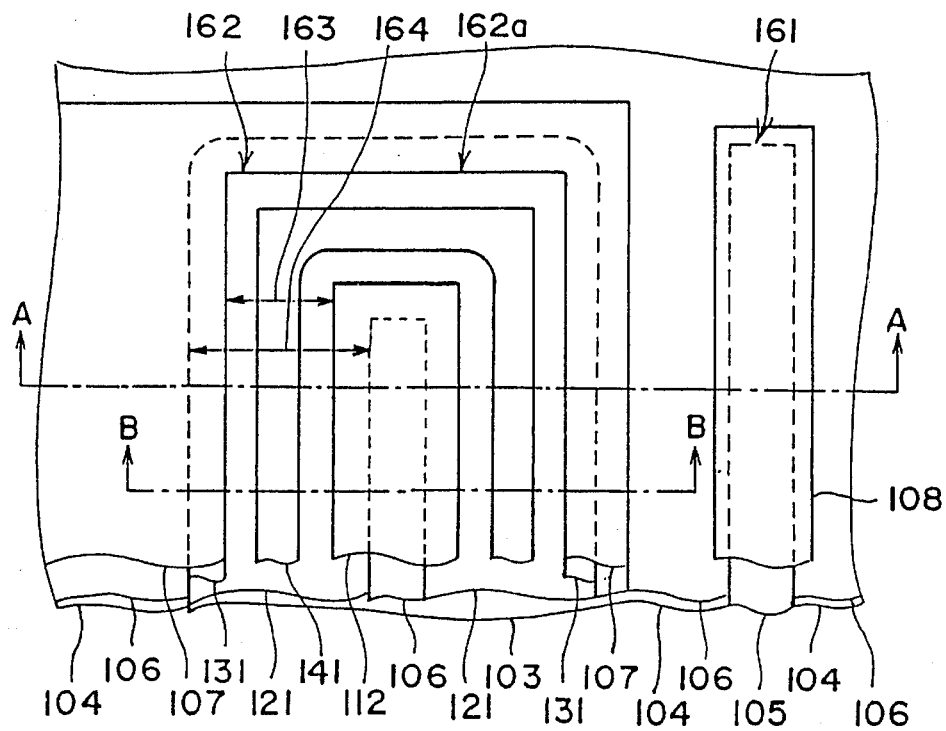
FIG. 2A is a diagrammatic plane view of a bipolar transistor.
Figure 2B:
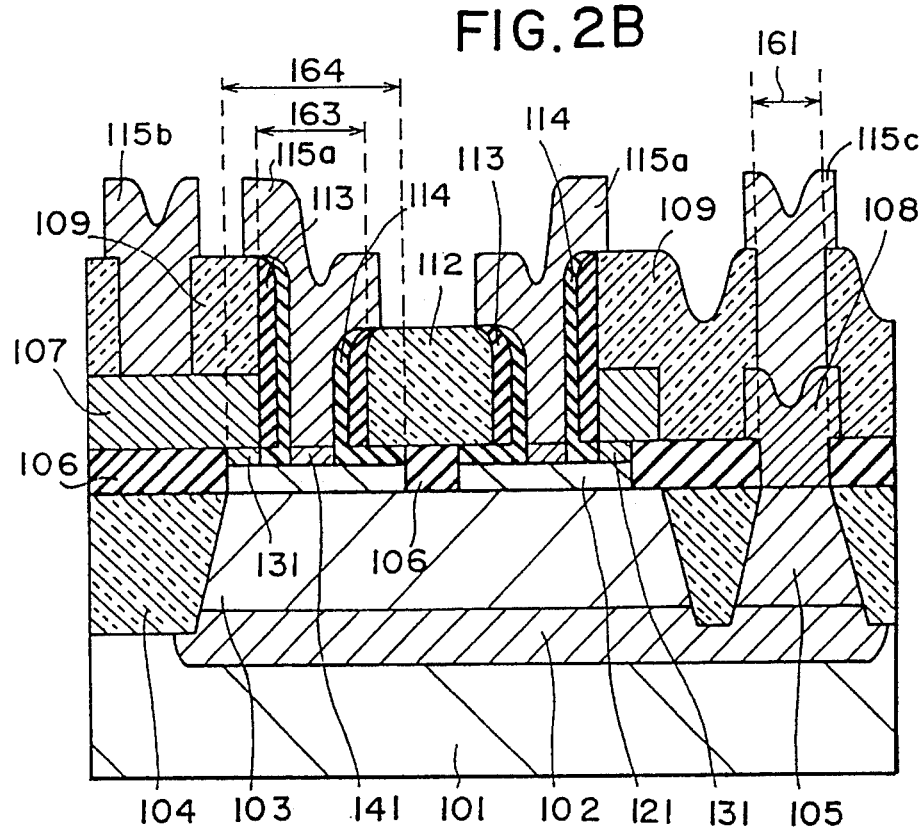
FIG. 2B is a diagrammatic sectional view thereof taken along line A—A in FIG. 2A showing a bipolar transistor of a first embodiment according to the invention.

FIG. 2A which is a diagrammatic plane view of a bipolar transistor and FIG. 2B which is a diagrammatic sectional view thereof taken along line A—A in FIG. 2A show a bipolar transistor of an SSSB structure as a first embodiment according to the invention. The structure of the bipolar transistor is as explained hereunder.

A $p^-$-type silicon substrate 101 having a resistivity of 10~15 $\Omega$.cm (at room temperature) and carrying on a part thereof an $n^+$-type buried layer 102 having a junction depth of about 2 $\mu$m and a peak impurity concentration of about $1 \times 10^{20}$ cm$^{-3}$ is covered by an $n^-$-type silicon epitaxial layer 103 having a film thickness of about 0.7 $\mu$m and a phosphorus concentration of about $1 \times 10^{16}$ cm$^{-3}$. The $n^-$-type silicon epitaxial layer 103 is element-isolated by a LOCOS type silicon oxide film 104 whose bottom surface extends to the $n^+$-type buried layer 102 carried by the $p^-$-type silicon substrate 101. The $n^-$-type silicon epitaxial layer 103 as well as with the LOCOS type silicon oxide film 104 is covered by an insulating film 106 constituted by a silicon nitride film (first insulating film) having a thickness of about 100 nm.

The insulating film 106 is provided with a window 161 and a second window 164 (and a window 163 which, although an imaginary one, is a first window). The window 161 is covered by a collector leading electrode 108 formed of an $n^+$-type polycrystalline silicon (also called "polysilicon") and having a thickness of about 200 nm. The $n^-$-type silicon epitaxial layer 103 immediately below the collector leading electrode 108 is provided with an $n^+$-type phosphorus diffusion layer 105 which is a collector plug region extending from the window 161 to the $n^+$-type buried layer 102 and which has a phosphorus concentration not less than $10^{19}$ cm$^{-3}$.

A predetermined window forming region 162a in the $n^-$-type silicon epitaxial layer 103 is surrounded by the LOCOS type silicon oxide film 104, the latter being larger at least by 0.1 $\mu$m in a cross section (second predetermined width). The $n^+$-type buried layer 102 is disposed below the predetermined window forming region 162a. Also, the $n^-$-type silicon epitaxial layer 103 of the predetermined window forming region 162a is electrically connected to the collector leading electrode 108 through the $n^+$-type buried layer 102 and the phosphorus diffusion layer 105. A base leading electrode 107 of a $p^+$-type polycrystalline silicon film having a thickness of about 200 nm and a boron concentration of about $10^{20}$ cm$^{-3}$ is selectively formed on the insulating film 108 in such a way that the boundary line of the predetermined window forming region 162a in the $n^-$-type silicon epitaxial layer 103 assumes an inner periphery of the base leading electrode 107. Also, an insulating film 109 (second insulating film) of a silicon oxide film having a thickness of about 300 nm is formed in contact with the insulating film 108, the collector leading electrode 108 and the base leading electrode 107 in such a way that the boundary line of the window forming region 162a of the $n^-$-type silicon epitaxial layer 103 assumes an inner periphery of the insulating film 109.

The outer periphery of the window 163 which is the first window is the boundary line of the window forming region 162a, and the opening width of the window 163 is about 0.25 $\mu$m (first predetermined width). Thus, the side face of the insulating film 109 and that of the base leading electrode 107 which are formed outside the window forming region 162a coincide with the outer periphery of the first window 163. The opening width of the window 164 which is the second window is about 0.45 $\mu$m and this second window 164 encloses the first window 163. The space between the outer periphery of the second window 164 and the outer periphery of the first window 163 and the space between the inner periphery of the second window 164 and the inner periphery of the first window 163 are respectively about 0.1 µm (second predetermined width). An insulating film 112 (third insulating film) formed of a silicon oxide film having a thickness of about 300 nm and covering the insulating film 106 is provided in such a way that the outer periphery thereof coincides with the inner periphery of the first window 163. The base leading electrode 107 and the insulating film 112 have a first and a second overhang portion extending inwardly from the outer periphery and the inner periphery of the window 164 with the widths (second predetermined width) of the overhang portions being about 0.1 µm, respectively.

The intrinsic base layer 121 is provided on the surface of the n⁻-type silicon epitaxial layer 103 which surface is exposed to the second window 164, the intrinsic base layer 121 being constituted by a p⁺-type monocrystalline silicon layer having a thickness of about 50 nm and a boron concentration of about $7 \times 10^{18}$ cm$^{-3}$. In self-alignment with the first overhang portion of the base leading electrode 107 (the under surface exposed by the window 164), a p-type polycrystalline semiconductor connecting layer 131 is formed in such a way that the upper surface thereof is in contact with the base leading electrode 107 and the lower surface thereof is in contact with the upper surface of the intrinsic base layer 121.

On the side faces of the insulating film 109 and the base leading electrode 107 that define the outer periphery of the window 163 and on the side faces of the insulating film 112 that define the inner periphery of the window 163, there are respectively provided spacers 113 (first spacers) formed of silicon oxide films (fourth insulating film) each having a thickness of about 50 nm. The spacers 113 are respectively covered by spacers 114 (second spacers) formed of silicon oxide films (fifth insulating films) each having a thickness of 30 nm. Each of the spacers 114 at the inner periphery side of the window 163 fills each space immediately below the second overhang portion. An emitter layer 141 of an n⁺-type monocrystalline silicon layer having a thickness of about 100 nm is provided on a surface of the intrinsic base layer 121 in self-alignment with the spacer 114. The width between the spacers 114, that is, between the spacer 114 at the outer periphery side of the window 163 and the spacer 114 at the inner periphery side thereof, is about 90 nm. An aluminum alloy electrode 115a, an aluminum alloy electrode 115b and an aluminum alloy electrode 115c are connected respectively to the emitter layer 141, the base leading electrode 107 and the collector leading electrode 108 through the window 163, the window that extends to the base leading electrode 107 provided to the insulating film 109 and the window that extends to the collector leading electrode 108, respectively.

The principal process steps for fabricating the semiconductor device according to the first embodiment of the invention is now explained with reference to FIGS. 2A and 2B, and also with reference to FIGS. 3A–3G which are diagrammatic sectional views taken along line B—B in FIG. 2A.

First, the n⁺-type buried layer 102 is selectively formed on a surface of the p⁻-type silicon substrate 101 and then the n⁻-type silicon epitaxial layer 103 covering the surface of the p⁻-type silicon substrate 101 is formed. The LOCOS type silicon oxide film 104 is selectively formed and then the insulating film 106 is formed thereon, the insulating film 106 being formed of a silicon nitride film (first insulating film) having a thickness of about 100 nm. With a photoresist film (not shown) being used as a mask, the opening 161 is formed and, with the same photoresist film being used as a mask, phosphorus ion-implantation is performed. After the removal of the photoresist film, the thermal treatment is carried out whereby the phosphorus diffusion layer 105 is formed (as seen FIGS. 3A and 3B).

Figure 3A:
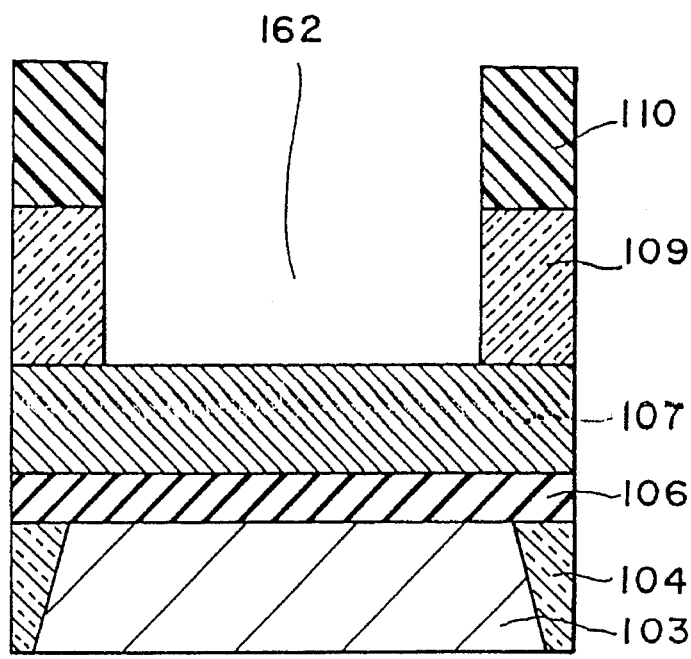
FIGS. 3A–3G are diagrammatic sectional views of the structure taken along line B—B in FIG. 2A for explaining the process steps for fabricating the semiconductor device of the first embodiment according to the invention.

Next, after the selective formation of the base leading electrode 107 formed of a p⁺-type polycrystalline silicon film having a thickness of about 200 nm and the collector leading electrode 108 formed of an n⁺-type polycrystalline silicon film having a thickness of about 200 nm, there is formed on the entire surface thereof an insulating film 109 formed of a silicon oxide film (second insulating film) having a thickness of about 300 nm. The base leading electrode 107 at this stage covers the predetermined window forming region 162a. Next, a photoresist film 110 having the same pattern as the predetermined window forming region 162a is formed. With this photoresist film 110 being used as a mask, the window 162 is formed in the insulating film 109 using a silicon oxide film by a normal dry etching process. The window 162 results in the same shape as the predetermined window forming region 162a and has an opening width of about 0.8 µm (FIGS. 2A and 2B and 3A).

Figure 3B:
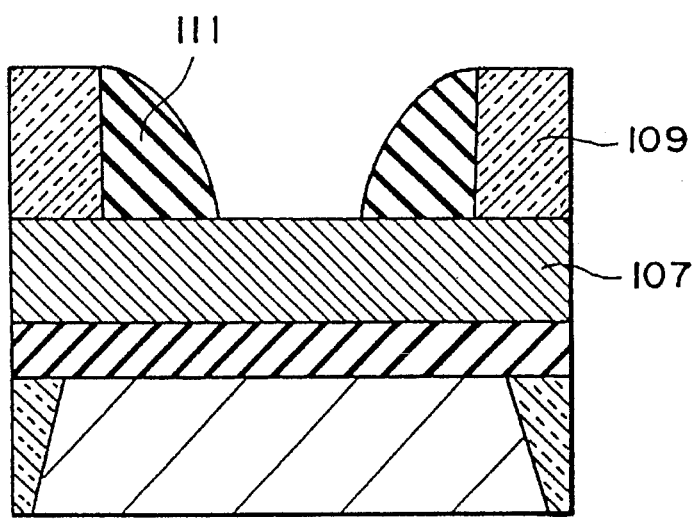

After the removal of the photoresist film 110, a silicon nitride film is deposited on the entire resulting surface using a Low-Pressure Chemical Vapor Deposition (LPCVD) process. This silicon nitride film is etched-back by an anisotropic dry etching, whereby a spacer 111 having a thickness of about 250 nm is formed at a side face of the insulating film 109 forming the side wall of the window 162 (FIG. 3B)

Figure 3C:
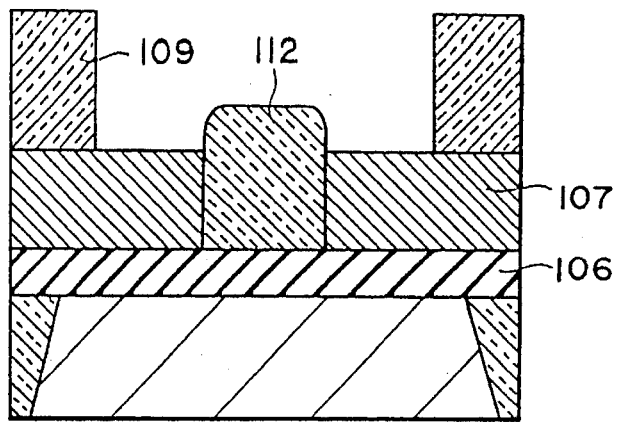

Next, the selective oxidation is performed using the spacer 111 as a mask whereby the exposed portion of the base leading electrode 107 is converted to an insulating film 112 formed of a silicon oxide film (third insulating film) having a thickness of about 300 nm. Then, the spacer 111 is removed by phosphoric acid (FIGS. 2A and 2B and 3C).

Figure 3D:
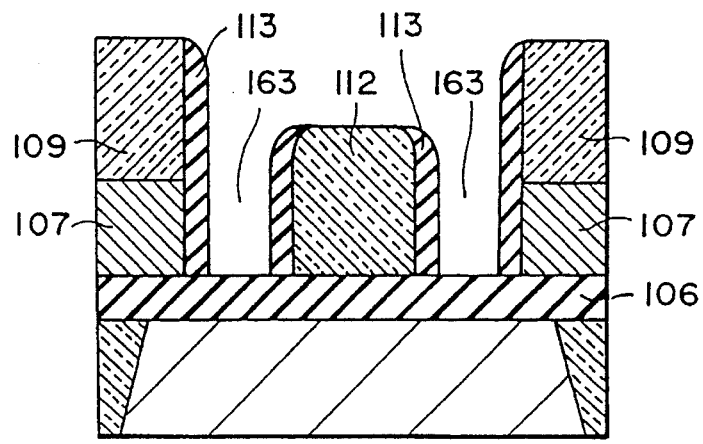

Then, with the insulating films 109 and 112 used as masks and the insulating film 106 used as an etching-stopper, the base leading electrode 107 is etched using an anisotropic dry etching process, whereby the window 163 (the first window) is formed. The opening width of this window 163 is about 250 nm (the first predetermined width). The outer periphery of the window 163 is coincident with the side wall of the window 162 and with the boundary line of the predetermined window forming region 162a. A silicon oxide film (the fourth insulating film) of about 50 nm thick is deposited on the entire surface by the LPCVD process. This silicon oxide film is etched-back thereby forming the spacers 113 (the first spacers) formed of silicon oxide films at side walls (the inner side walls being constituted by side faces of the insulating film 109 and the base leading electrode 107 and the inner side wall being constituted by side faces of the insulating film 112) of the window 163 (FIGS. 2A and 2B and 3D).

Figure 3E:
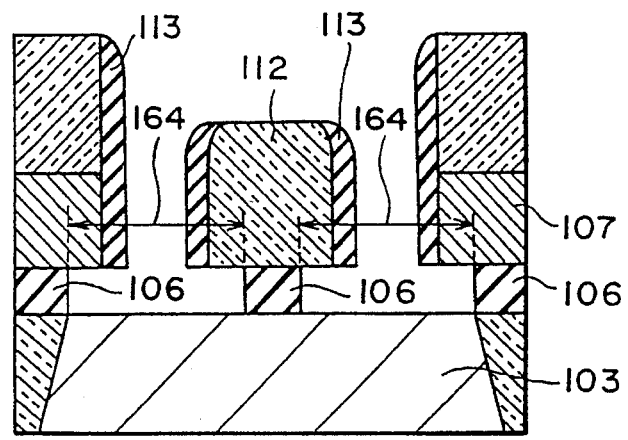

Next, with the insulating films 109 and 112 and the spacer 113 used as masks, the wet etching using phosphoric acid is performed sufficiently so that the window 163 reaches the n⁻-type silicon epitaxial layer 103 and that, by further progress of the side-etching of the insulating film 106, the second windows 164 are formed. By the formation of each of these windows 164, a portion of the bottom surface of the base leading electrode is exposed thereby forming an overhang portion (the first overhang portion) having a width of about 100 nm (the second predetermined width) and a portion of the bottom surface of the insulating film 112 is exposed thereby forming an overhang portion (the second overhang portion) having a width of about 100 nm (the second predetermined width)—(FIGS. 2A and 2B and 3E).

Figure 3F:
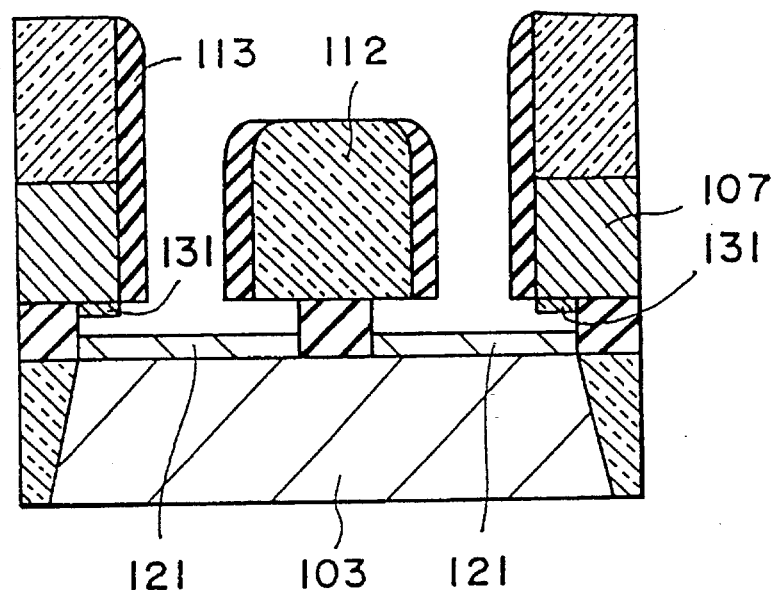

Then, the silicon epitaxial growth using an ultra-high vacuum takes place. The growth conditions include a temperature of 605° C., a pressure of about $5 \times 10^{-4}$ Torr, an $Si_2H_6$ flow rate of 2 sccm and a growth rate of about 10 nm/min, and the addition of $B_2H_6$ is made at an appropriate flow rate. This enables the selective growth of the intrinsic base layer 121 formed of a p-type monocrystalline silicon layer on a surface of the n⁻-type silicon epitaxial layer 103 which surface is exposed by the window 164. This intrinsic base layer 121 is substantially free from facet formation. On the under surface of the base leading electrode 107 at the first overhang portion, there is selectively formed a p-type polycrystalline semiconductor connecting layer 131 formed of a p-type polycrystalline silicon layer (FIG. 3F).

Figure 3G:
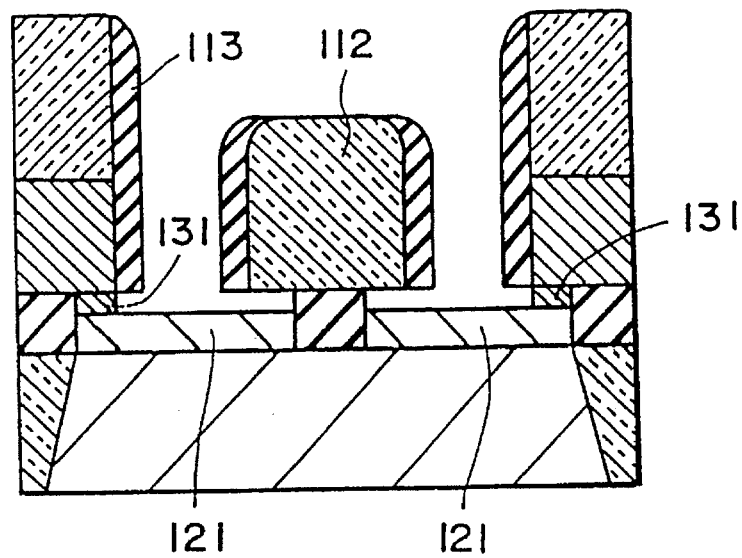

As the above silicon epitaxial growth further progresses, the upper surface of the intrinsic base layer 121 and the under surface of the p-type polycrystalline silicon connecting layer 131 come in contact with each other at the point where, for example, the thickness of the intrinsic base layer 121 becomes 50 nm and that of the p-type polycrystalline silicon connecting layer 131 becomes 50 nm (FIGS. 2A and 2B and 3G).

Thereafter, by the LPCVD process using $Si(OC_2H_5)_4$ (TEOS) as a main material, a silicon oxide film (the fifth insulating film) is deposited on the entire surface to a thickness of about 30 nm. This silicon oxide film has an excellent coverage property so that the second overhang portion is also filled by this silicon oxide film. The silicon oxide film is etched-back whereby the spacer 114 is formed. The space between the spacer 114 at the outer periphery of the window 163 and the spacer 114 at the inner periphery of the window 163 is about 90 nm. Then, by using the same silicon epitaxial growth process as above (except that $AsH_3$ is added instead of $B_2H_6$), an emitter layer 141 of an n⁺-type monocrystalline silicon layer having a thickness of about 100 nm is formed on the exposed surface of the intrinsic base layer 121 in self-alignment with respect to the spacer 114. The windows which respectively reach the base leading electrode 107 and the collector leading electrode 108 are formed in the insulating film 109, and an aluminum alloy film is deposited on the entire surface and is patterned whereby aluminum alloy electrodes 115a, 115b and 115c are respectively formed (FIGS. 2A and 2B).

As explained above, the width of the emitter layer according to this embodiment is, for example, about 90 nm and this value is sufficiently and significantly smaller than the minimum processing limit (for example, 0.4 μm) known in the photolithography. Any variations in the widths of the layers are dependent mainly on processing precision of spacers 111 (processing precision of opening widths of the first windows 163). The spacers 111 are formed in silicon nitride films by the LPCVD process so that an absolute error in thickness of the spacers will be 3~5%. Therefore, in the structure according to the embodiment of the invention, it is possible to realize emitter layers in which the variations in the widths are smaller and the widths are much thinner than in the prior art.

Figure 4:
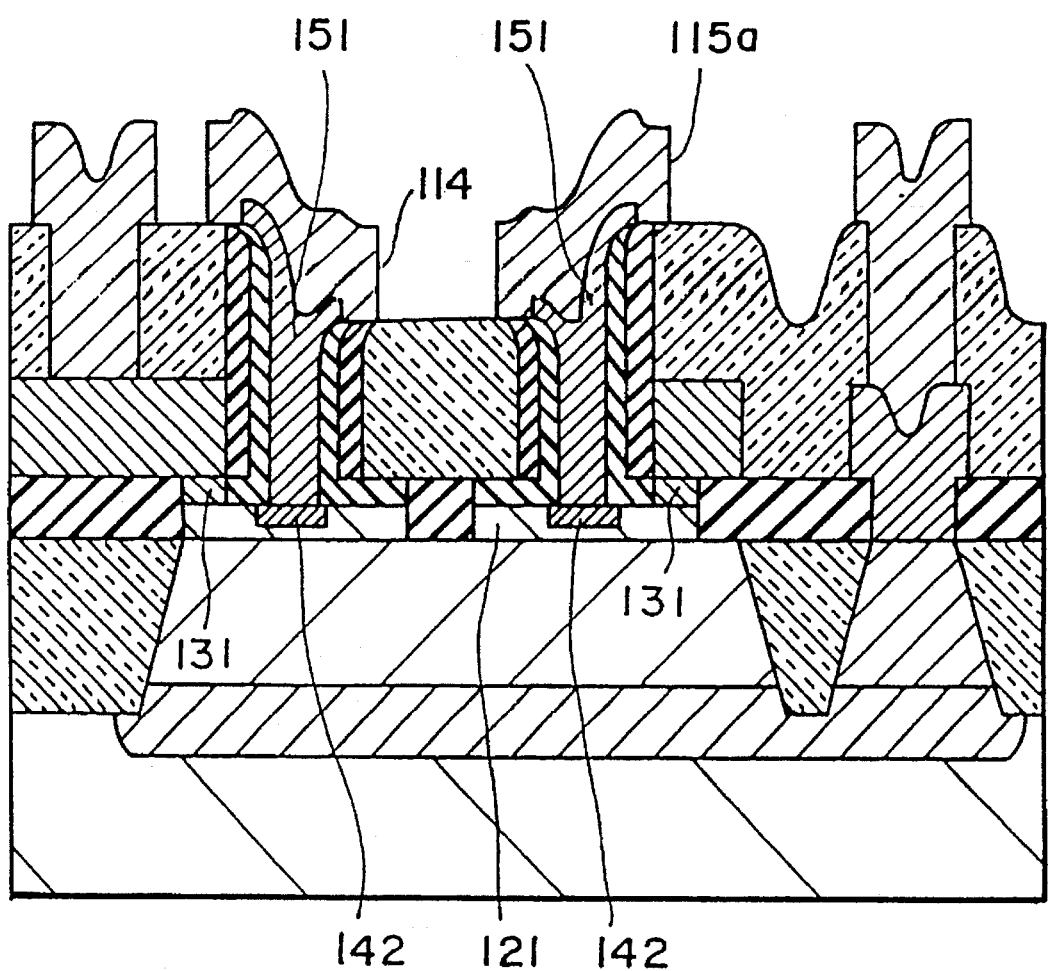
FIG. 4 is a diagrammatic sectional view of a bipolar transistor of a second embodiment according to the invention.

FIG. 4 shows, in a diagrammatic sectional view, a bipolar transistor having the SSSB structure of a second embodiment according to the invention. The differences in the structure of this second embodiment as compared with that of the above first embodiment reside in that the emitter layer 142 formed of the n⁺-type monocrystalline silicon layer is formed not on the surface of the intrinsic base layer 121 but is formed in the surface thereof and that the structure has an emitter leading electrode 151 formed of n⁺-type polycrystalline silicon film. The emitter leading electrode 151 covers the spacer 114 and is disposed on the upper surface of the intrinsic base layer 121. The emitter layer 142 is formed by the thermal diffusion of an n-type impurity (for example, arsenic (As)) that is subjected from the emitter leading electrode 151 to the surface of the intrinsic base layer 121. According to this second embodiment, the base width becomes narrower than that obtained in the first embodiment resulting in the significant enhancement of the current amplification factor ($h_{FE}$) of the transistor as compared with the first embodiment.

Figure 5A:
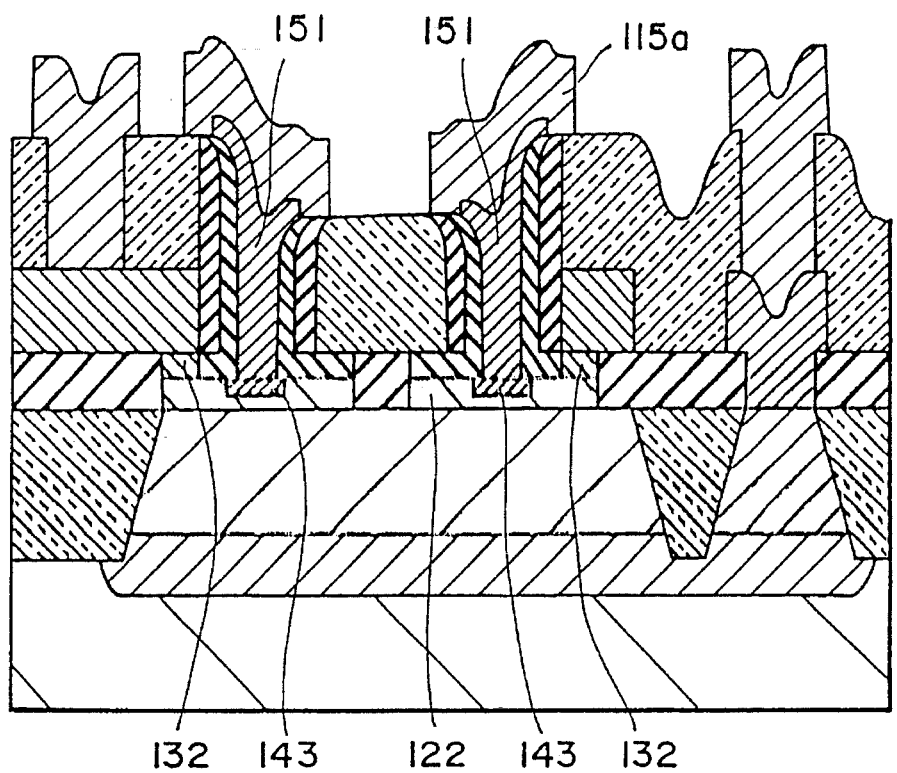
FIG. 5A is a diagrammatic sectional view of a bipolar transistor of a third embodiment according to the invention.
Figure 5B:
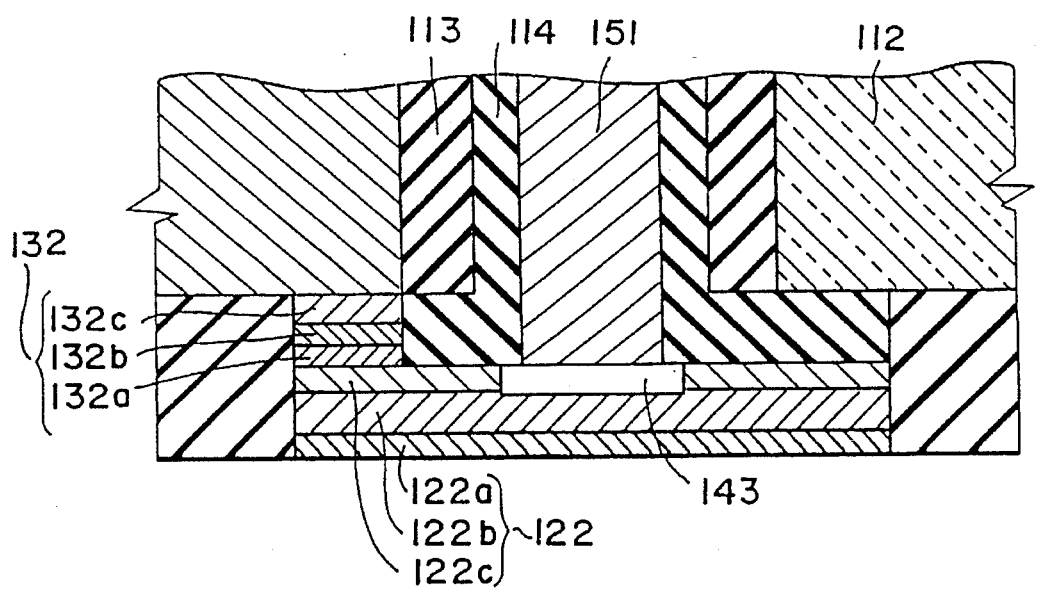
FIG. 5B is a partial sectional view of a portion of the structure taken from FIG. 5A.

FIG. 5A shows, in diagrammatic sectional view, a bipolar transistor having the SSSB structure of a third embodiment according to the invention. FIG. 5B shows in a partial sectional view a portion of the structure taken from FIG. 5A. Firstly, the differences between this third embodiment and the above second embodiment are in the points that the structure of the intrinsic base layer 122 formed of a p-type monocrystalline semiconductor layer and the structure of the p-type polycrystalline semiconductor connecting layer 132 in this embodiment are respectively different from the structure of the intrinsic bass layer 121 and the p-type polycrystalline semiconductor connecting layer 131 in the second embodiment. Secondly, the structure of the emitter layer 143 formed of an n⁺-type monocrystalline semiconductor layer in this embodiment is different from the structure of the emitter layer 142 formed of an n⁺-type monocrystalline silicon layer in the second embodiment.

Specifically, as shown in FIG. 5B, the intrinsic base layer 122 is a film in which a p⁻-type silicon-germanium mixed monocrystalline layer 122a, a p⁺-type silicon-germanium mixed monocrystalline layer 122b and a p⁻-type silicon-germanium mixed monocrystalline layer 122c are stacked in this order from the bottom. In the p⁻-type silicon-germanium mixed monocrystalline layers 122a, 122c which are respectively the lower layer and the upper layer, the thickness, boron concentration and germanium concentration are about 10 nm, less than about $1 \times 10^{17}$ cm⁻³ and about 10%, respectively. In the p⁺-type silicon-germanium mixed crystal layer 122b (the middle layer), the thickness, boron concentration and germanium concentration are about 30 nm, about $7 \times 10^{18}$ cm⁻³ and about 10%. On the other hand, the p-type polycrystalline semiconductor connecting layer 132 is a film in which a p⁻-type silicon-germanium mixed polycrystalline layer 132a, a p⁺-type silicon-germanium mixed polycrystalline layer 132b and a p⁻-type silicon-germanium mixed polycrystalline layer 132c are stacked in this order from the bottom. The emitter layer 143 is an n⁺-type silicon-germanium mixed monocrystalline layer having a thickness of about 10 nm.

An advantage in this third embodiment is that, since the uppermost layer 122c of the intrinsic base layer 122 is the p⁻-type silicon-germanium mixed polycrystalline layer, the occurrence of parasitic barriers caused by the external diffusion of boron is suppressed.

Figure 6A:
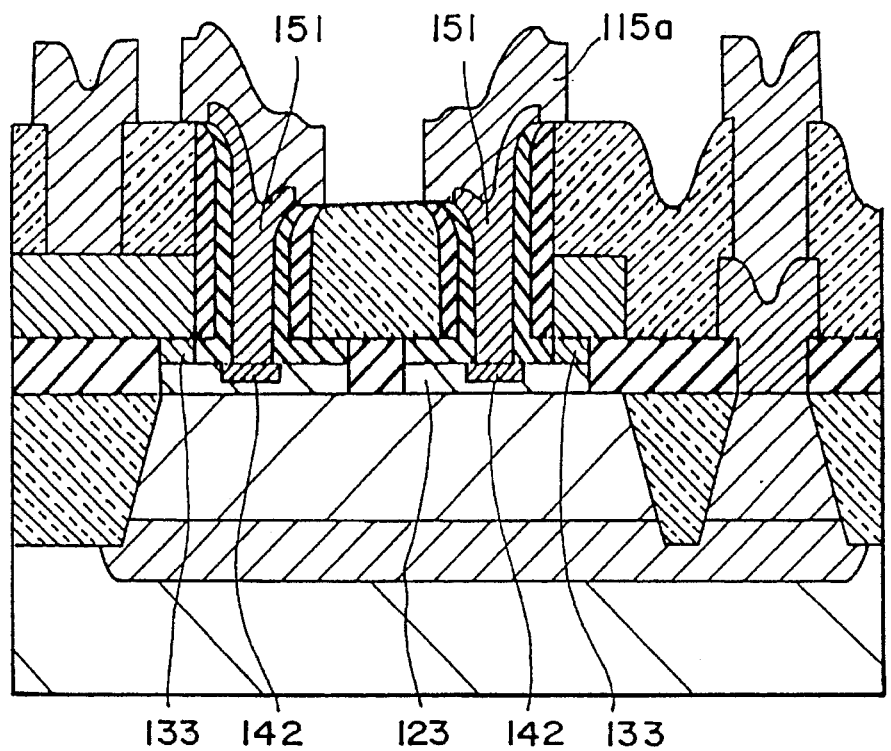
FIG. 6A is a diagrammatic sectional view of a bipolar transistor of a fourth embodiment according to the invention.
Figure 6B:
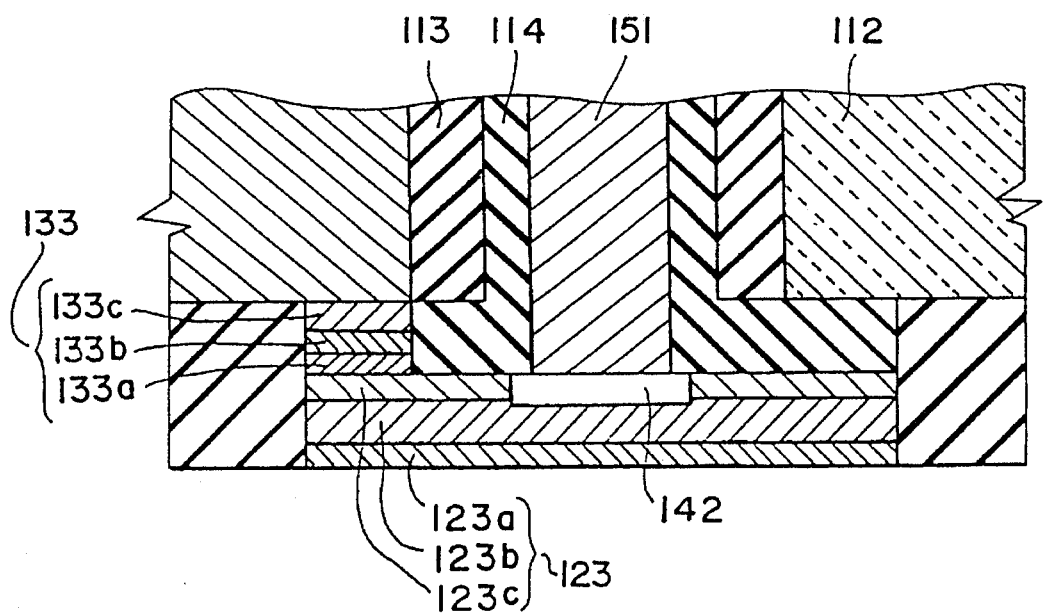
FIG. 6B is a partial sectional view of a portion of the structure taken from FIG. 6A.

FIG. 6A shows, in a diagrammatic sectional view, a bipolar transistor having the SSSB structure of a fourth embodiment according to the invention. FIG. 6B shows in a partial sectional view a portion of the structure taken from FIG. 6A. The differences in the structure of this fourth embodiment as compared with that of the first embodiment are that the intrinsic base layer 123 and the p-type polycrystalline semiconductor connecting layer 133 are respectively different from the intrinsic base layer 121 and the p-type polycrystalline semiconductor connecting layer 131 in the first embodiment.

Specifically, as shown in FIG. 6B, the intrinsic base layer 123 is a film in which a p⁻-type silicon-germanium mixed monocrystalline layer 123a, a p⁺-type silicon-germanium mixed monocrystalline layer 123b and a p⁻-type silicon-germanium mixed monocrystalline layer 123c are stacked in the order mentioned from the bottom. In the p⁻-type silicon-germanium mixed monocrystalline layers 123a and 123c, the thickness, boron concentration and germanium concentration are, respectively, less than about 10 nm, about $1\times10^{17}$ cm$^{-3}$ and about 10%. In the p⁺-type silicon-germanium mixed crystal layer 123b, the thickness and the boron concentration are about 30 nm and about $7\times10^{18}$ cm$^{-3}$, respectively. The germanium concentration therein is about 10% at the lower end portion and decreases in a direction to and becomes 0% at the upper end portion. The p-type polycrystalline semiconductor connecting layer 133 is a film in which a p⁻-type silicon-germanium mixed polycrystalline layer 133a, a p⁺-type silicon-germanium mixed polycrystalline layer 133b and a p⁻-type silicon-germanium mixed polycrystalline layer 133c are stacked in this order from the bottom. The emitter layer 142 is an n⁺-type silicon-germanium mixed monocrystalline layer having a thickness of about 10 nm as is the case in the second embodiment.

In the structure of the fourth embodiment having the intrinsic base layer 123 as described above, there are advantages that, due to the p⁻-type monocrystalline silicon layers, the electric field within the base/emitter depletion layer is weakened thereby reducing tunnel currents and, due to the germanium concentration gradient in the p⁺-type silicon-germanium mixed monocrystalline layer 123b, there is produced an accelerating electric field for minor carriers.

Figure 7:
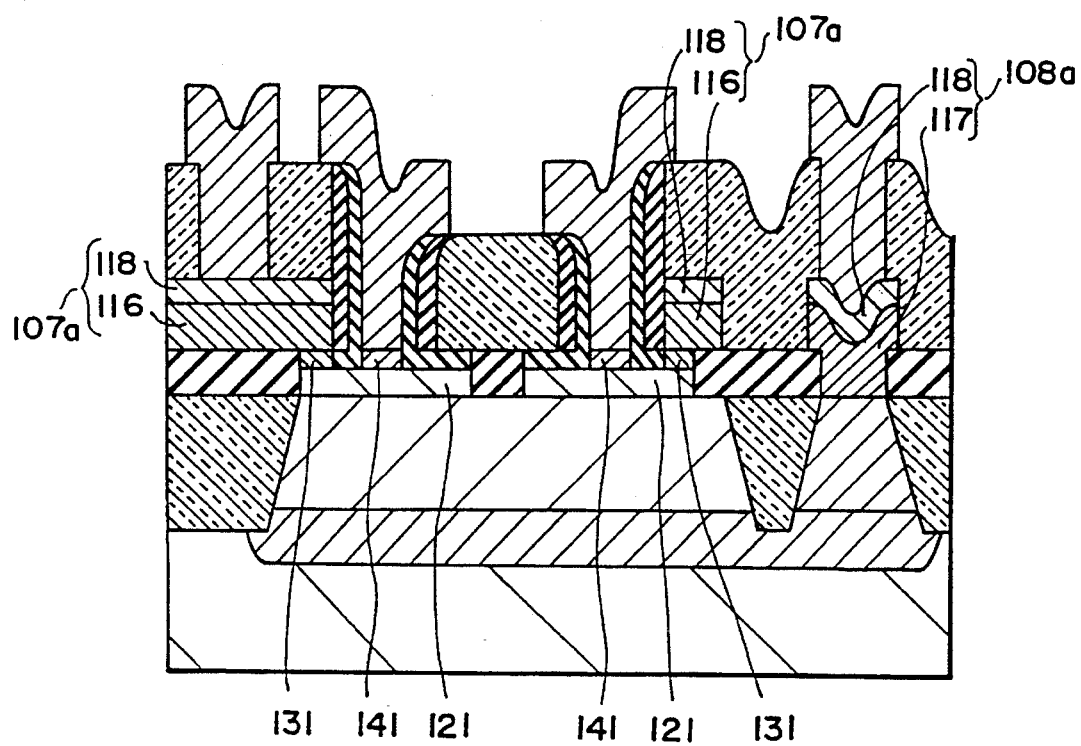
FIG. 7 is a diagrammatic sectional view of a bipolar transistor of a fifth embodiment according to the invention.

FIG. 7 shows, in a diagrammatic sectional view, a bipolar transistor having the SSSB structure of a fifth embodiment according to the invention. In this fifth embodiment, unlike in the first embodiment, the base leading electrode 107a is comprised of a p⁺-type polycrystalline silicon layer 116 and a tungsten silicide layer 118 stacked with each other, and the emitter leading electrode 108a is comprised of an n⁺-type polycrystalline silicon layer 117 and a tungsten silicide layer 118 stacked with each other.

An advantage in the above fifth embodiment over the first embodiment is that, due to the configuration of the base leading electrode 107a, the base resistance is reduced. It is possible to apply this feature to the second, third and fourth embodiments described above.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor device comprising:

a monocrystalline semiconductor layer;

a first insulating film covering said monocrystalline semiconductor layer;

a base leading electrode disposed on said first insulating film;

a second insulating film provided on said base leading electrode a predetermined pattern window provided in said base leading electrode and said second insulating film;

a third insulating film provided in a middle portion between peripheries of said predetermined pattern window;

a first window provided between an inner side of said second insulating film as well as an inner side of said base leading electrode and an outer side of said third insulating film;

a second window provided below said first window and provided in said first insulating film, said second window extending outwardly from said inner side of said base leading electrode and inwardly from said outer side of said third insulating film so as to be larger than said first window such that said base leading electrode has a first overhang portion and said third insulating film has a second overhang portion;

an intrinsic base region provided in said second window in the same plane as said first insulating film;

first spacers having an inner first spacer covering said outer side of said third insulating film and an outer first spacer covering said inner sides of said second insulating film and said base leading electrode;

second spacers having an inner second spacer covering said inner first spacer and an under surface of said second overhang portion of said third insulating film and an outer second spacer covering said outer first spacer;

a base connecting layer provided between an under surface of said first overhang portion of said base leading electrode and an upper surface of said intrinsic base region, for electrically connecting said base leading electrode with said intrinsic base region; and an emitter layer provided on said intrinsic base region and in self-alignment with said inner second spacer and said outer second spacer.

2. A semiconductor device comprising:

a monocrystalline silicon layer of a first conductivity type provided on a surface of a silicon substrate; a first insulating film covering said monocrystalline silicon layer;

a first window disposed at a predetermined window forming region on said first insulating film and having an outer periphery thereof at a boundary line of said predetermined window forming region and an inner periphery thereof away from said outer periphery of said predetermined window forming region for a first predetermined distance;

a second window extending from said first window and disposed in said first insulating film, said second window being larger than said first window by a second predetermined distance;

a base leading electrode disposed on said first insulating film at an outer periphery side of said second window, and having a first overhang portion extending to the outer periphery of said first window from the outer periphery of said second window for said second predetermined distance;

a second insulating film provided on said base leading electrode in self-alignment with said base leading electrode;

a third insulating film disposed on said first insulating film at an inner periphery side of said second window and having a second overhang portion extending to the inner periphery of said first window from the inner periphery of said second window for said second predetermined distance;

first spacers formed of fourth Insulating films covering respectively sides of said second insulating film and said base leading electrode defining the outer periphery of said first window, and a side of said third insulating film defining the inner periphery of said first window;

an intrinsic base layer made of monocrystalline semiconductor layer of the opposite conductivity type disposed in said second window and on said monocrystalline silicon layer with an under surface of said intrinsic base layer being in contact with said monocrystalline silicon layer;

a polycrystalline semiconductor connecting layer of the opposite conductivity type interconnecting said base leading electrode and said intrinsic base layer and having an upper surface being in contact with said base leading electrode and self-aligned with said first overhang portion and an under surface being in contact with said intrinsic base layer;

second spacers formed of fifth insulating films covering a side and an under surface of said first spacer provided at said outer periphery of said first window, a side of said polycrystalline semiconductor connecting layer, a side and an under surface of said first spacer provided at the inner periphery side of said first window, an under surface of said third insulating film, and a side of said second insulating film, respectively, and having an under surface being in contact with an upper surface of said intrinsic base layer; and an emitter layer made of monocrystalline semiconductor layer of the first conductivity type self-aligned with said second spacers and having at least an under surface thereof being in contact with the upper surface of said intrinsic base layer.

3. A semiconductor device according to claim 2, in which said monocrystalline semiconductor layer of the first conductivity type constituting said emitter layer is provided in an upper surface of said monocrystalline semiconductor layer of the opposite conductivity type constituting said intrinsic base layer, with said upper surface of the said monocrystalline semiconductor layer of the first conductivity type and said upper surface of said monocrystalline semiconductor layer of the opposite conductivity type being disposed in a common plane.

4. A semiconductor device according to claim 2, in which said monocrystalline semiconductor layer of the opposite conductivity type forming said intrinsic base layer is a silicon-germanium mixed monocrystalline layer and said polycrystalline semiconductor connecting layer of the opposite conductivity type is a silicon-germanium mixed polycrystalline layer.

5. A semiconductor device according to claim 3, in which said monocrystalline semiconductor layer of the opposite conductivity type forming said intrinsic base layer is a silicon-germanium mixed monocrystalline layer and said polycrystalline semiconductor connecting layer of the opposite conductivity type is a silicon-germanium mixed polycrystalline layer.

6. A semiconductor device according to claim 2, in which said monocrystalline semiconductor layer of the opposite conductivity type forming said intrinsic base layer comprises a silicon-germanium mixed monocrystalline layer of the opposite conductivity type as a lower layer and a monocrystalline silicon layer of the opposite conductivity type as an upper layer, and said polycrystalline semiconductor connecting layer of the opposite conductivity type comprises a polycrystalline silicon layer of the opposite conductivity type as a lower layer and a silicon-germanium mixed polycrystalline layer of the opposite conductivity type as an upper layer.

7. A semiconductor device according to claim 3, in which said monocrystalline semiconductor layer of the opposite conductivity type forming said intrinsic base layer comprises a silicon-germanium mixed monocrystalline layer of the opposite conductivity type as a lower layer and a monocrystalline silicon layer of the opposite conductivity type as an upper layer, and said polycrystalline semiconductor connecting layer of the opposite conductivity type comprises a polycrystalline silicon layer of the opposite conductivity type as a lower layer and a silicon-germanium mixed polycrystalline layer of the opposite conductivity type as an upper layer.

8. A semiconductor device according to claim 2, in which said base leading electrode comprises a polycrystalline silicon film of the opposite conductivity type as a lower layer and a silicide film as an upper layer.

9. A semiconductor device according to claim 8, in which said silicide film includes a tungsten silicide.

* * * * *